US006221720B1

(12) United States Patent
Fukuda (10) Patent No.: US 6,221,720 B1
(45) Date of Patent: Apr. 24, 2001

(54) METHOD OF MAKING AN ELECTRONIC DEVICE AND THE SAME

(75) Inventor: Hiroshi Fukuda, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/599,649

(22) Filed: Jun. 23, 2000

Related U.S. Application Data (60) Continuation of application No. 09/329,319, filed on Jun. 10, 1999, now Pat. No. 6,127,246, which is a division of application No. 08/843,145, filed on Apr. 28, 1997, now Pat. No. 5,945,686.

(51) Int. Cl.[7] .................................................. H01L 21/336
(52) U.S. Cl. ............................................................. 438/268
(58) Field of Search ................................. 257/14; 438/268

(56) References Cited

U.S. PATENT DOCUMENTS

| | | |
|---|---|---|
| 4,704,622 | 11/1987 | Capasso et al. . |
| 5,138,405 | 8/1992 | Kuzuhara . |
| 5,372,675 | 12/1994 | Wakabayashi et al. . |
| 5,444,267 | 8/1995 | Okada et al. . |
| 5,600,163 | 2/1997 | Yano et al. . |
| 5,604,154 * | 2/1997 | Takahashi et al. .................... 437/186 |
| 5,646,418 | 7/1997 | Frazier et al. . |
| 5,710,436 | 1/1998 | Tanamoto et al. . |
| 5,714,766 | 2/1998 | Chen et al. . |
| 5,739,057 * | 4/1998 | Tiwari et al. ......................... 438/172 |

FOREIGN PATENT DOCUMENTS

| | | |
|---|---|---|
| 8-097305 | 4/1996 | (JP) . |
| 8-306905 | 11/1996 | (JP) . |

OTHER PUBLICATIONS

Applied Physics, vol. 63, No. 12, 1994, pp. 1232–1238.
The Journal of Institute of Electronics, Information and Communication Engineers of Japan, vol. 11, 1994, pp. 1117–1124.
Journal of Non–Crystalline Solids, vol. 128, 1991, pp. 91–100.
Journal of Vacuum Science and Technology, vol. B11, 1993, pp. 2532–2537.
1997 American Institute of Physics Letter, vol. 70, No. 3, Jan. 20, 1997, pp. 333–335.
1996 Electronic Materials Conference, Jun. 26–28, 1996.

\* cited by examiner

*Primary Examiner*—Olik Chaudhuri
*Assistant Examiner*—Douglas A. Wille
(74) *Attorney, Agent, or Firm*—Mattingly, Stanger & Malur, P.C.

(57) ABSTRACT

Laminated layers including semiconductor or metal thin layers and insulative thin layers are formed on a substrate and after the laminated layers are patterned, the laminated layers are oxidized from their side to form an oxidized area. This way, a 0-dimensional quantum box or one-dimensional quantum line having fine tunnel junctions surrounded by the oxidized area and a 0-dimension quantum box or a one-dimensional quantum line made of semiconductor or metal area interposed between the oxidized area and the insulative thin layers are formed in the laminated layers.

10 Claims, 5 Drawing Sheets

METHOD OF MAKING AN ELECTRONIC DEVICE AND THE SAME

This is a continuation application of U.S. Ser. No. 09/329,319, filed Jun. 10, 1999, now U.S. Pat. No. 6,127,246 which is a divisional application of U.S. Ser. No. 08/843,145, now U.S. Pat. No. 5,945,686.

BACKGROUND OF THE INVENTION

The present invention relates to a method of fabricating an electronic device suitable for single-electron devices, various quantum effect devices and the like as well as to the electronic device fabricated by such a method.

In order to improve the performance of the electronic device, such as a silicon integrated circuit (LSI), fine-structuring of elements constituting the circuit is being advanced. However, MOS transistors mainly used at present in the devices have a limitation in improving integration and operation speed by this fine-structuring while suppressing increased power consumption.

Recently, in order to solve the limitation, single-electron elements have been proposed as electronic elements based on a new operation principle. When the elements are realized ideally, it is expected that the power delay product can be improved greatly. The single-electron element is described in, for example, APPLIED PHYSICS, Vol. 63, No. 12 (1994), pp. 1232–1238. Further, it is considered that the 0-dimensional quantum box for confining electrons in an area of several nm three-dimensionally can be used to improve the performance of light emitting elements or the like greatly by the quantum effect. In addition, it is considered that a one-dimensional quantum line can be used to form one-dimensional electron gas, so that the mobility of electrons can be increased greatly and a high-speed switching element can be realized. The 0-dimensional quantum box ideally means that electrons are fixed at one point of coordinates and the one-dimensional quantum line ideally means that electrons can be moved only in one direction. The quantum effect elements are discussed in, for example, the report of the Institute of Electronics and Communication Engineers of Japan, Vol. 77, No. 11 (1994), pp. 1117–1124.

However, as discussed in the above paper, in order to operate the single-electron device at room temperature, it is necessary to fabricate a device structure having a size of several nm which is smaller by one or two orders than several hundred nm for the size of the currently leading MOS transistor with accuracy. The quantum effect element such as the 0-dimensional quantum box and the one-dimensional quantum line are also the same.

For example, it is considered that an electron storage node is connected through two tunnel junctions to an external wiring. When a voltage is applied from the external wiring, electrons attempt to pass through the electron storage node through the tunnel junctions. However, energy of the electron storage node is increased by the storage energy for one electron in a short time that the electron passes through the electron storage node and consequently a next electron is prevented from entering the storage node subsequently. Thus, for example, by disposing a gate electrode to change a potential of the electron storage node by application of a voltage from the gate, a tunnel current passing through the storage node can be controlled. However, in order to attain such control at the room temperature, the energy in case where one electron is stored in the storage node must be sufficiently larger than thermal noise.

In other words, $e^2/2C > kT$ and accordingly the following equation must be satisfied.

$$C(aF) < 929/T(K)$$

where e represents an elementary charge, C represents a capacitance of the electron storage node, T represents an operating temperature in Kelvin, k represents the Boltzmann's constant, and a of aF represents an abbreviation of "atto-" meaning $10^{-18}$. When a sectional area, a thickness and a dielectric constant of the two tunnel junctions are S, d and e, respectively, the following equation is given using $C = 2\epsilon S/d$ $$S < e^2 d/4\epsilon kT$$

For example, when the thickness of tunnel insulative layer is 2 nm, the sectional area S of the tunnel junctions is required to be made sufficiently smaller than 200 $nm^2$ in order to satisfy the above condition at the room temperature. That is, it is necessary to form tunnel junctions having a sectional area of at least 100 $nm^2$ or less, preferably several $nm^2$ to several tens $nm^2$.

At present, there is no fabricating apparatus capable of attaining such super-fine structures and furthermore there is scarcely any prospect capable of attaining mass production with good reproductivity. Further, in order to achieve stable operations for the single electron devices, it is desirable to form a multi-tunnel junction having tunnel junctions formed in series, while a more complicated fabricating process is required therefor and it is difficult to cope with the process by the current lithography technique.

Furthermore, an experimental result that thin layers are laminated on a substrate to form tunnel junctions is reported in Journal of Non-Crystalline Solids, 128 (1991), 91–100. However, there is no teaching as to how transistors, memories and light emitting elements are fabricated when the laminated structure is formed on the substrate in the vertical direction to the substrate to form the tunnel junctions. A relevant memory technique is disclosed in U.S. Ser. No. 291,752 filed Aug. 16, 1994 and assigned to the same assignee as the present invention (U.S. Pat. No. 5,600,163).

SUMMARY OF THE INVENTION

It is an object of the present invention to provide a fabricating method of an electronic device in which a semiconductor pattern formation apparatus and a device fabricating apparatus used in conventional fabrication of a silicon integrated circuit can be used to accurately attain the dimension of several nm required to operate single-electron elements and various quantum effect elements at room temperature and an electronic device having an element structure fabricated by this method.

In order to achieve the above object, according to the present invention, laminated layers including semiconductor or metal thin layers and insulative thin layers are formed on a substrate and after the laminated layers are patterned, and the laminated layers are oxidized from their side to form an oxidized area, so that a 0-dimensional quantum box or one-dimensional quantum line having fine tunnel junctions surrounded by the oxidized area and a 0-dimension quantum box or one-dimensional quantum line made of semiconductor or metal area interposed between the oxidized area and the insulative thin layers are formed in the laminated layers.

When the laminated layers processed into the form of pillar are oxidized, the semiconductor or metal line including fine tunnel junctions or 0-dimensional quantum box on the way of the pillar in the center of the pillar and extending in the substantially perpendicular direction to the substrate are obtained.

Alternatively, laminated layers in which semiconductor or metal thin layers are interposed between a plurality of insulative layers are processed into an oblong rectangular parallelepiped and when the rectangular parallelepiped is oxidized from its side, semiconductor or metal lines extending in the substantially parallel direction to the substrate are obtained in the rectangular parallelepiped.

It is desirable that the thickness of the insulative thin layers and the semiconductor or metal layers interposed between two insulative thin layers is equal to or smaller than 20 nm. Particularly, it is desirable that the insulative layers are thin. The thickness thereof is equal to or smaller than 10 nm, at the best 3 to 2 nm, for $SiO_2$ or SiN. It is not necessary to thin the semiconductor or metal layers so much and the thickness thereof is satisfactory if it is about 20 nm. Further, oxidization is made until the oxidization speed is equal to or smaller than one fourth, preferably one fifth, of a value in bulk of the semiconductor or metal to thereby obtain the super-fine structure stably. The side of the laminated layers may be etched instead of the oxidization, so that the above various structures may be formed.

The above another object is achieved by oxidizing the laminated layer pattern including semiconductor or metal thin layers and insulative thin layers from the side thereof in the electronic device to form a one-dimensional quantum line having fine tunnel junctions in the laminated layer or forming semiconductor or metal area surrounded by the oxidized area and the insulative thin layers into a 0-dimensional quantum box or one-dimensional quantum line.

The semiconductor/metal lines including tunnel junctions, electron storage nodes (0-dimensional quantum box) and the like on the way in the center of the pillar-shaped insulator perpendicular to the substrate and the semiconductor/metal lines extending in the parallel direction to the substrate in the center of the rectangular parallelepipedic insulator are obtained. It is preferable that the diameter of the line and the dimension of the electron storage node or 0-dimensional quantum box are equal to or smaller than 20 nm. Silicon or the like, can be used as the semiconductor. A gate electrode may be formed around the line or the electron storage node.

Figure 1A:
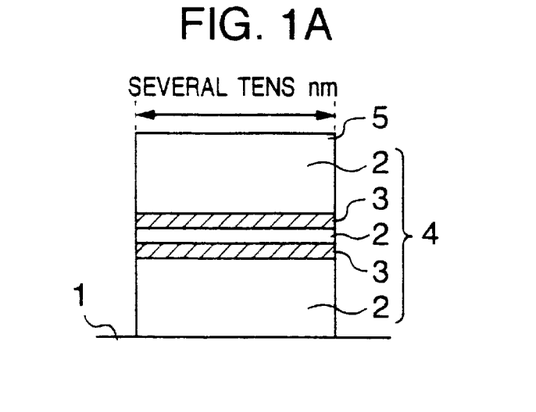
FIGS. 1A to 1C are schematic diagrams illustrating the principle of the present invention.
Figure 1B:
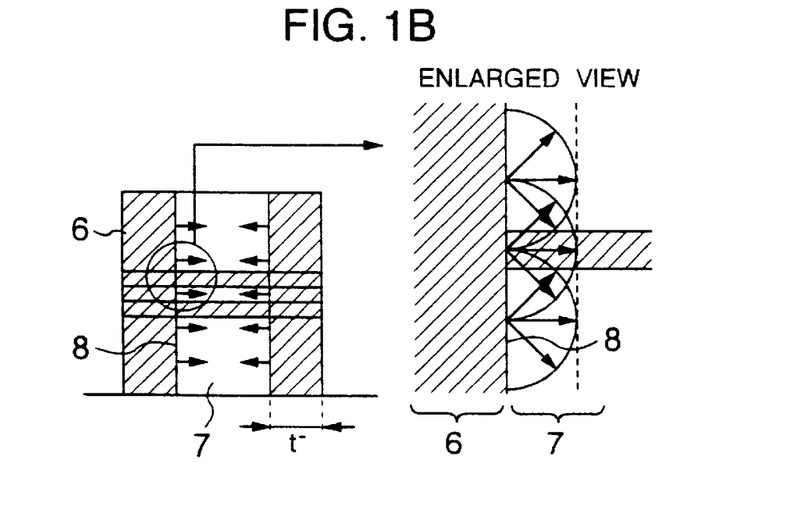
Figure 1C:
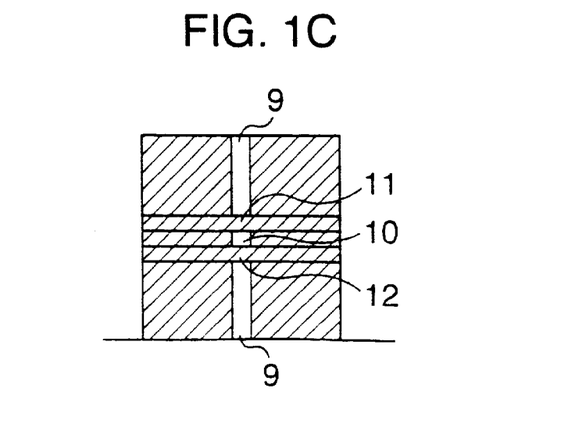

Referring now to FIG. 1, fabricating processes of a device according to the present invention are described simply.

The existing layer fabricating technique, the electron beam lithography method and the anisotropic etching can be used to form a column 5 made of laminated layers 4 including silicon layers 2 and insulative layers 3 on a substrate 1 as shown in FIG. 1A and having a diameter of several tens nm (50 nm in this case). The column 5 having the laminated structure is oxidized from the side thereof. Although not shown, an oxidization prevention layer of, for example, silicon nitride layer is formed on an upper surface of the column 5 in order to perform the oxidization from only the side.

Consequently, only the silicon portions of the laminated layers are oxidized from the periphery of the column and the insulative layers are left as they are. This is because since the oxidization is controlled at the speed of diffusion of oxygen in the silicon oxide layer as shown in FIG. 1B, boundaries 8 of oxidized regions 6 and unoxidized regions 7 are moved toward the center of the column in the vertical direction to the surface of the column 5 regardless of the presence of the insulative layers. Accordingly, after a proper oxidization time, as shown in FIG. 1C, a silicon line 9 is formed in the center of the column 5 and a very fine island 10 is formed in the silicon line 9 so that the island 10 is interposed between two tunnel junctions 11 and 12. For example, a diameter thereof is 10 nm, preferably 3 to 5 nm and a sectional area of a quantum line can be made to 100 $nm^2$ or less.

Since the island 10 thus formed is operated as an electron trap for capturing a single electron, the structure of FIG. 1C can be used as a basic element of the single-electron element. However, in order to apply this structure to the single-electron element, it is necessary to connect conductors to upper and lower portions of the silicon column. Further, it is preferable to provide a proper gate electrode in the periphery of the island. A definite method thereof is described in embodiments.

It is known from a paper in Journal of Vacuum Science and Technology, Vol. B11 (1993), pp. 2532–2537 that when a silicon pillar is oxidized from the periphery thereof, the oxidization speed is reduced as the oxidization is advanced and the pillar-shaped silicon line is obtained in self-limiting manner. This is considered due to the fact that as the oxidization is advanced from the surface of the pillar, the silicon expands and the stress is exerted within the pillar so that the oxidization is impeded. In order to give such stress within the pillar uniformly to obtain the accurate line, it is considered that the columnar pattern is preferable.

Figure 2:
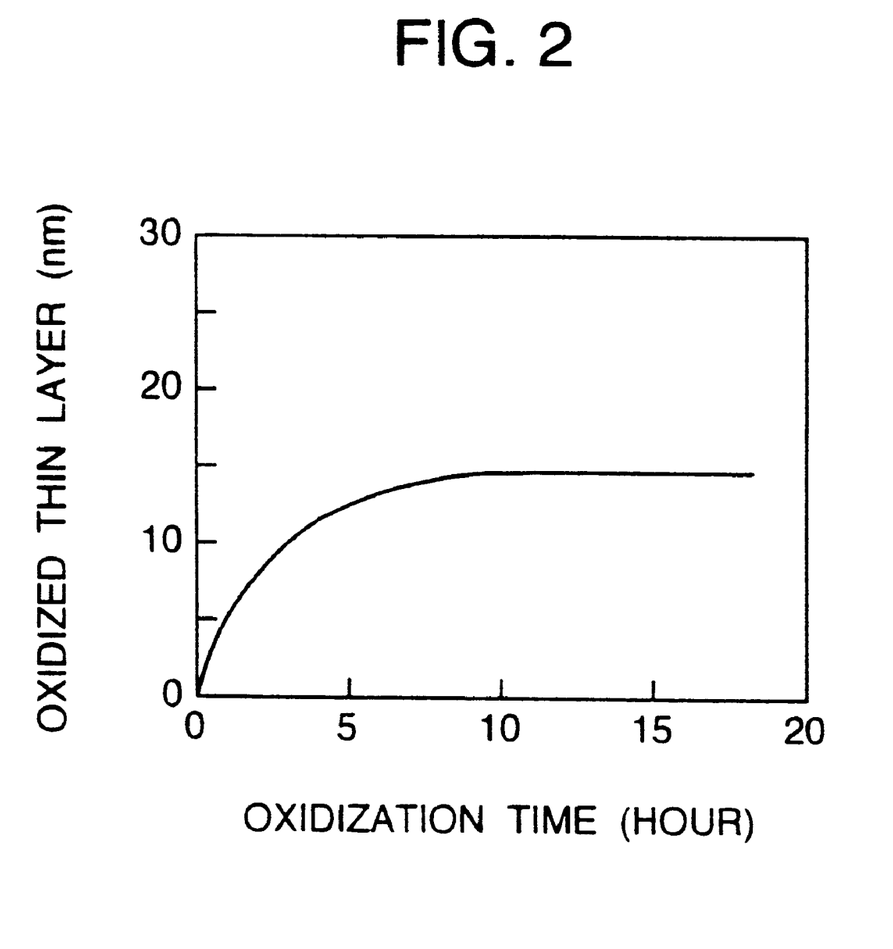
FIG. 2 is a graph showing the characteristic of the fabricating method of the electronic device according to the present invention.

FIG. 2 shows an example of a relation of an oxidization time and a thickness (t in FIG. 1B) of the oxidized area around the silicon column. Since this relation depends on the pattern form and the oxidization condition, it is desirable that these conditions are optimized in order to make the diameter of the line to a desired value. However, since a diameter of the line obtained finally at the time that the oxidization is saturated does not depend on the size of the pattern of the laminated layers provided before the oxidization, the oxidization is made for a sufficient time to thereby obtain the line having a fixed diameter relatively stably irrespective of scattered size of the original pattern. For this purpose, it is generally desirable that the oxidization is made until the oxidization speed reaches one fifth or less of a value of the bulk. Anyway, the diameters of the line and the island in the present invention can be controlled with high accuracy.

Further, the thickness of the insulative layers and the island interposed between the insulative layers can be also controlled accurately in accordance with the fabricating conditions of the laminated layers. Accordingly, the ultra-small structure which cannot be obtained possibly by the conventional method in which the lithography is used to form the tunnel junctions and the island horizontally can be realized while controlling the property of the junctions and the capacitance of the island with accuracy. The thickness of the oxidized layer and the diameter of the line formed in self-limiting manner can be formed extremely uniformly in a wide area of the substrate. Accordingly, deviation of the electric characteristics within the substrate can be suppressed and it can be desirably applied to the case where a large number of elements are integrated.

The device using silicon and oxide layer has been described, while the device is not limited to silicon and another semiconductor or metal may be used. Further, another insulative layer (nitride layer, calcium fluoride, alumina or the like) may be used for the oxide layer.

Further, semiconductors of different kinds may be laminated. For example, the line according to the present invention can be formed in the semiconductor heterostructure having laminated semiconductors having different band structures. Even in this case, similar effects can be obtained. Further, by laminating a large number of insulative layers and semiconductor layers, a large number of islands can be arranged in the vertical direction so that the 0-dimensional quantum boxes can be formed three-dimensionally with very high packing density. Such structure is useful for various light emitting elements.

Further, by forming the pattern of the laminated layers in which oxidization is made into an oblong cube, semiconductor or metal lines extending in the substantially parallel direction to the substrate are formed within the cube. Such a structure can be used as one-dimensional channel of a field effect transistor, for example. In addition, the pattern of laminated layers can be devised to thereby obtain various fine structures. Anyway, in order to obtain the single-electron effect or the quantum effect at the room temperature, it is preferable that the thickness of the insulative thin layer or the semiconductor or metal layer interposed between two insulative thin layers is equal to or smaller than 20 nm.

Further, even when the laminated layers are side-etched instead of oxidized, a similar structure can be obtained, while generally it is necessary to pay attention to the fact that the etching speeds of the insulative layer and the semiconductor/metal layer are different in this case. Ideally, it is desirable that both the etching speeds are equal, while in order to obtain a desired structure, it is necessary that at least the etching speed of the insulative layer is slower than that of the semiconductor/metal layer.

Further, the electronic device structure proposed specifically by the present invention comprises substrate and a pilar-shaped laminated pattern of a laminated structure including first thin layers of semiconductor or metal formed on the substrate and second thin layers of insulator, the laminated structure constituting tunnel junctions.

In such a structure, a gate electrode can be formed on the side of the tunnel junctions (that is, the side of the pillar-shaped structure) to thereby control storage and transfer of electric charges. An area of the tunnel junctions is desirably as small as, for example, 100 $nm^2$ or less, preferably about 50 $nm^2$ or less. In order to reduce the area of the tunnel junctions, the etching or the oxidization from the side of the laminated pattern can be used as described above. At this time, a plurality of tunnel junctions may be formed as described above. When an area for trapping electrons is formed by the tunnel junctions of the laminated pattern, the area constitutes an electric barrier and the gate can be used to control a current flowing through the laminated pattern in the direction perpendicular to the substrate. Such operation can be used to constitute a transistor element and a memory. Electrodes for input and output may be disposed in the upper or lower portion of the laminated pattern and such electrodes can be fabricated by the conventional semiconductor manufacturing technique. In order to facilitate attachment of the electrodes, it is preferable that the sectional area of the upper or lower (substrate side) of the pillar-shaped structure is made larger than that of the tunnel junctions.

DETAILED DESCRIPTION OF THE PREFERRED EMBODIMENTS

Embodiment 1

Figure 3A:
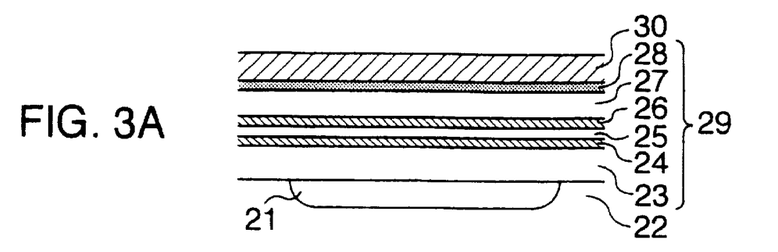
FIGS. 3A to 3E are sectional views schematically illustrating the fabricating method of the electronic device according to an embodiment of the present invention.

Referring now to FIGS. 3A to 3E, a transistor element according to an embodiment of the present invention is described. A well 21 is formed on a silicon substrate 22 by means of the conventional ion implantation and laminated layers 29 including a polysilicon layer 23 (100 nm in thickness), a silicon oxide layer 24 (10 nm in thickness), a polysilicon layer 25 (10 nm in thickness), a silicon oxide layer 26 (10 nm in thickness), a polysilicon layer 27 (100 nm in thickness) and a silicon nitride layer 28 (100 nm in thickness) are formed on the substrate 22 in order of the description from the substrate (FIG. 3A).

Figure 3B:
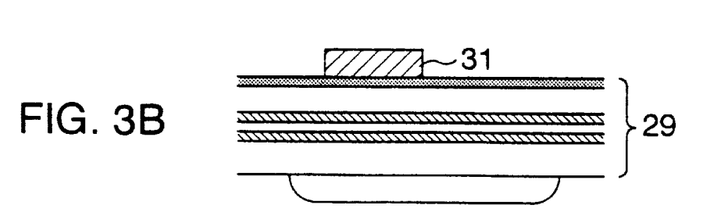

Further, a negative type resist layer 30 for electron beam is formed on the laminated layers and then the electron beam lithographic apparatus is used to form a dotted pattern so that a predetermined developing is performed to form a columnar resist pattern 31 having the diameter of 50 nm (FIG. 3B).

Figure 3C:
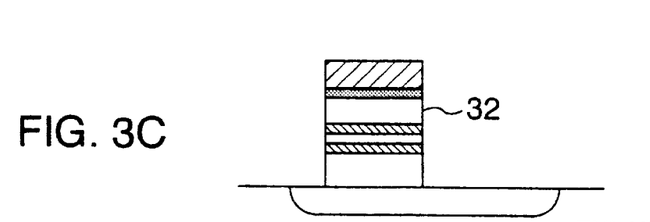

Next, the laminated layers disposed below the resist pattern 31 is subjected to anisotropic dry etching while using the resist pattern as a mask to form a columnar structure 32 of laminated layers (FIG. 3C).

Figure 3D:
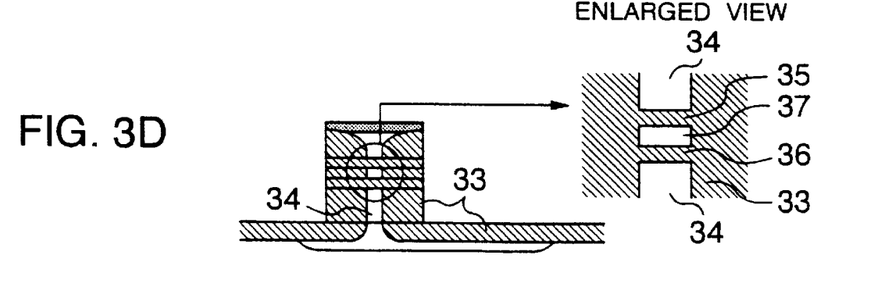

Thereafter, the columnar structure 32 of laminated layers and an exposed portion of the silicon substrate 32 are subjected to dry oxidizing at 850 degrees C for five hours, so that a silicon oxide layer 33 is formed in the area containing a cylindrical portion where the center of the column is left. Since the oxidization speed is reduced as the oxidization is advanced, a silicon line 34 having the diameter of 10 nm is formed in the center of the column in self-limiting manner. Since the silicon oxide layers 24 and 26 traverse the silicon line 34, fine tunnel junctions 35 and 36 and an island area 37 of silicon are formed in the silicon line 34 (FIG. 3D).

Further, the polysilicon is formed on the condition that a relatively large grain diameter is obtained in order that there is no polycrystalline grain boundary in the line and the island area. Accordingly, the line and the island area are considered to be made of monocrystalline substantially. Since supply of oxygen in the upper portion and the lower portion (specifically lower portion) of the column is suppressed by a nitride layer cap and the substrate, the diameter of the line in the upper and lower portion thereof is large. This structure is preferable for connection of the line to the external wiring.

Figure 3E:
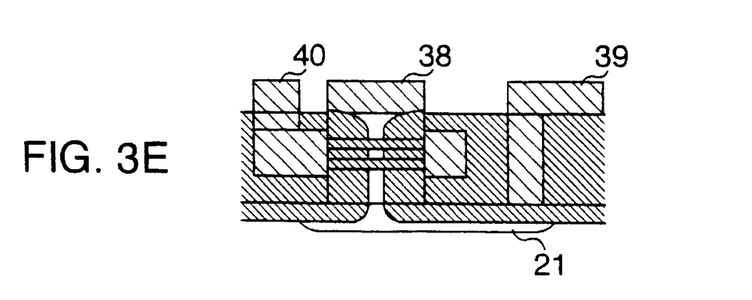

Next, a source electrode 38 is connected to the upper portion of the silicon line 34 and a drain electrode 39 is connected to the well 21 to which the lower portion of the silicon line is connected. Further, a gate is formed in the outer portion of the cylinder so that the gate surrounds the silicon island and a gate electrode 40 is connected to the gate (FIG. 3E).

These electrodes can be formed by using various methods used in the conventional silicon LSI process. The above gate is formed by the side wall but another method may be used. When the electrodes are connected to the line, it is necessary to pay sufficient attention so that excessive contact resistances are not produced therebetween. When it is necessary to shorten a distance between the gate and the island, the silicon oxide layer 23 may be etched to thereby thin the cylindrical silicon oxide layer surrounding the line.

As a result of investigation of the characteristics of the element at the room temperature, the Coulomb's stair that a conductance of a current flowing in the line with respect to a drain voltage is oscillated has been observed and it has been confirmed that the element is operated as a single-electron transistor. Further, the conductance between the source and the drain could be controlled by the gate voltage. Accordingly, the element can be used as a three-terminal element to form a circuit.

In addition, a large number of elements of the embodiment have been formed in a wide area on the substrate and as a result the thickness of the silicon and the oxide layer and the diameter of the line formed in self-limiting manner were extremely uniform within the substrate. Accordingly, the uniform electric characteristics could be obtained within the substrate.

Embodiment 2

Figure 4A:
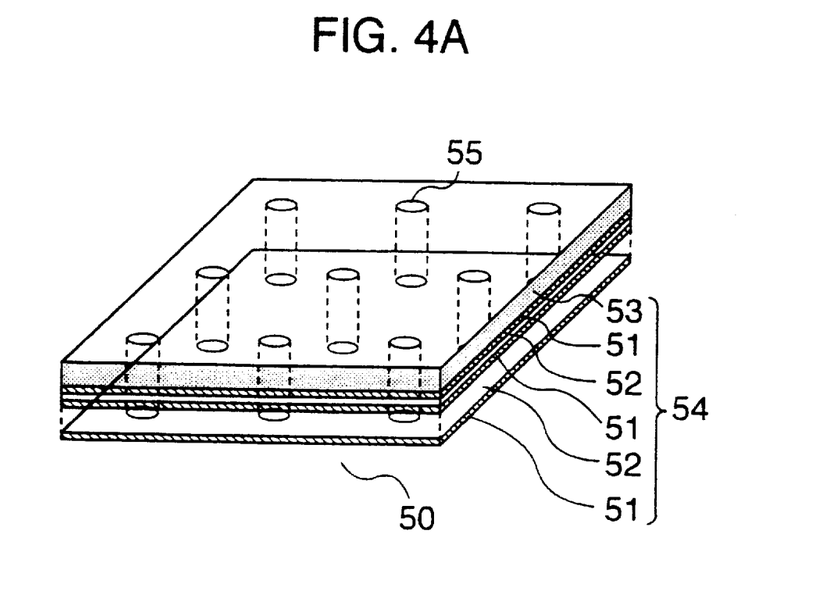
FIGS. 4A and 4B are perspective views schematically illustrating the fabricating method of the electronic device according to another embodiment of the present invention.
Figure 4B:
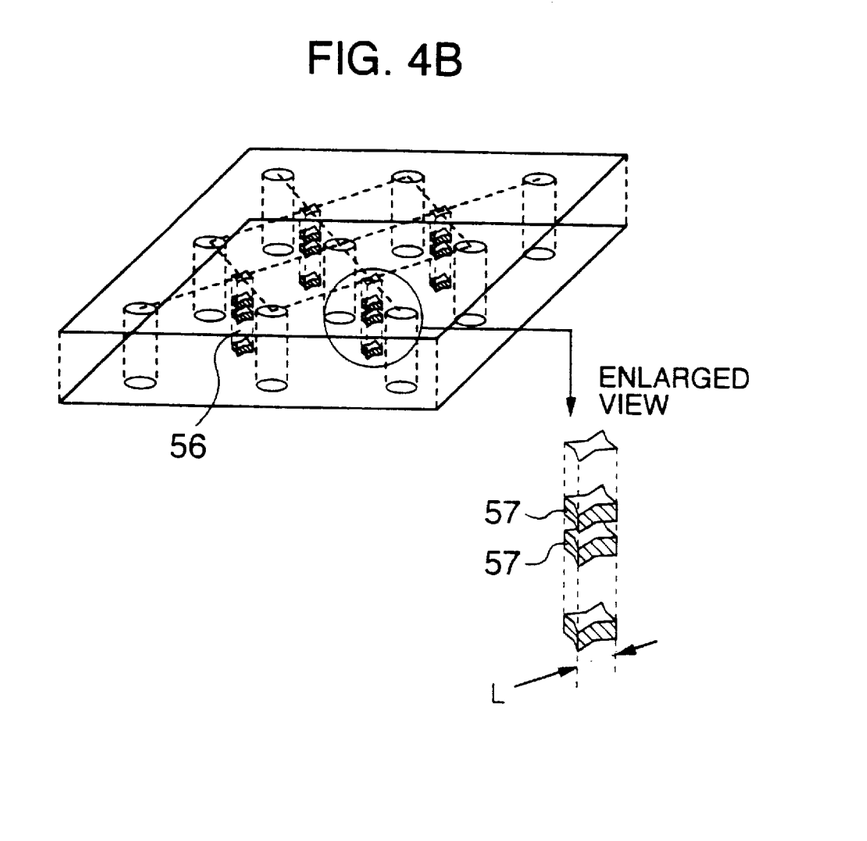

FIGS. 4A and 4B illustrate a second embodiment of the present invention. Laminated layers 54 including 20 layers composed of polysilicon layers 51 having a thickness of 10 nm and silicon oxide layers 52 having a thickness of 10 nm and a silicon nitride layer 53 are formed on a silicon substrate 50. The laminated layers are patterned by the method similar to the first embodiment to form a plurality of hole patterns 55 in the laminated layers (FIG. 4A).

In FIG. 4, only a part of the 20 layers are shown. When the laminated layers having the plurality of hole patterns are oxidized, the oxidization is advanced from the side of the holes, so that an oxidized area is finally formed between nearest holes so that the nearest holes come into contact with each other through the oxidized area and original laminated layer structures 56 are left in intersection positions of diagonal lines connecting four holes (FIG. 4B).

The oxidization is controlled to be stopped when the dimension L in the plane direction of the remaining area of the laminated layers is equal to about 10 nm.

As a result, cubic silicon 0-dimensional quantum boxes 57 having one side of about 10 nm are arranged at intervals of 20 nm in the perpendicular direction to the substrate. The thickness of layers and the number of layers are not limited to the values of the embodiment, while it is preferable that the size of the quantum box is set to 20 nm or less.

It is considered that emission of light can be observed by making light excitation to the structure obtained by the embodiment.

Embodiment 3

Figure 5A:
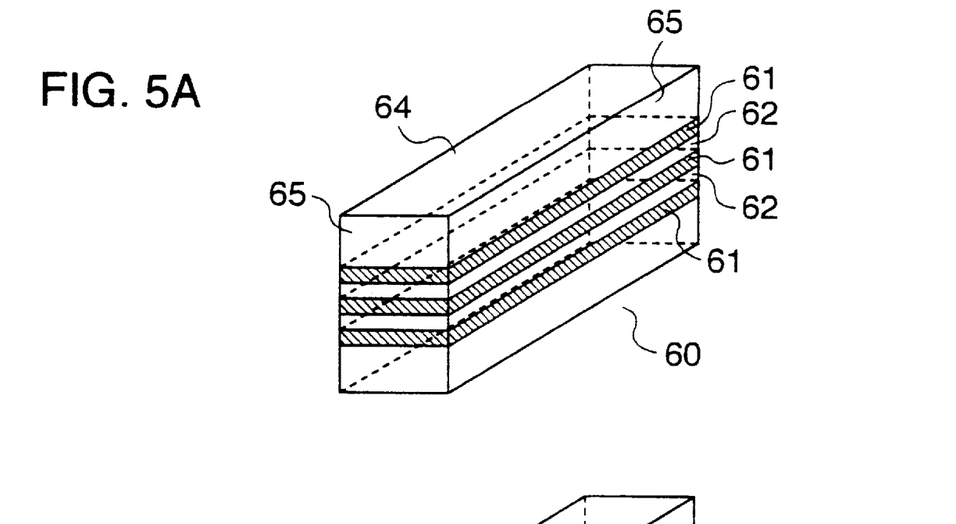
FIGS. 5A to 5C are perspective views schematically illustrating the fabricating method of the electronic device according to another embodiment of the present invention.
Figure 5B:
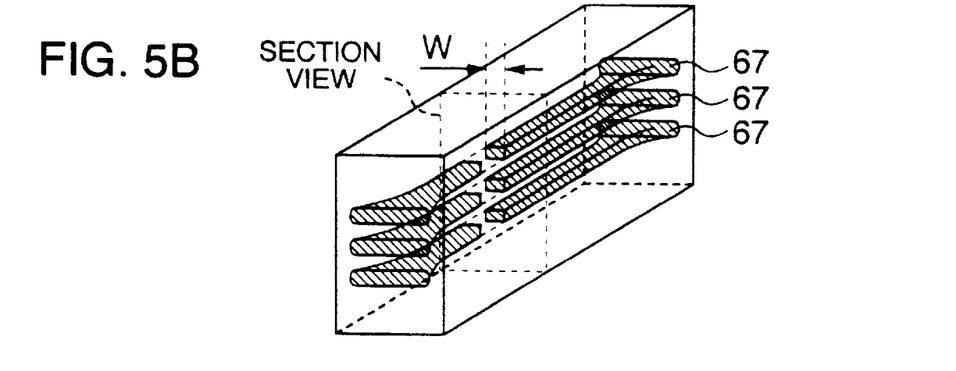
Figure 5C:
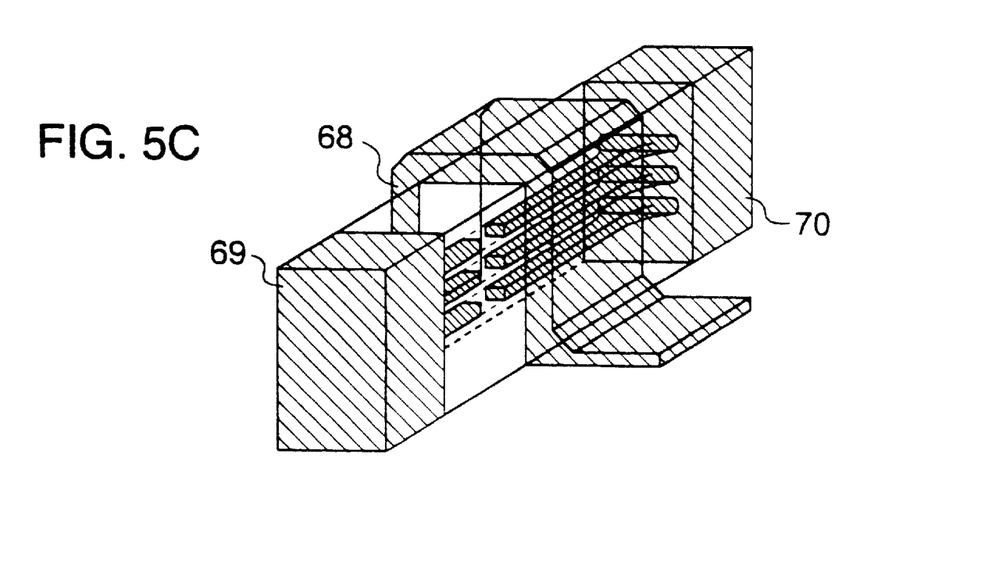

FIGS. 5A to 5C illustrate a third embodiment of the present invention. Laminated layers including 20 layers composed of polysilicon layers 61 having a thickness of 10 nm and silicon oxide layers 62 having a thickness of 10 nm and a silicon nitride layer (not shown) are formed on a silicon substrate 60. The laminated layers are patterned by the method similar to the first embodiment to form a rectangular parallelepipedic structure 64 and then a pair of sides 65 of the structure is covered by nitride layers (not shown) (FIG. 5A).

In FIG. 5, only a part of 20 layers is shown. The polysilicon in the laminated layers is oxidized from a pair of remaining sides which are not covered by the nitride layers to thereby leave a laminated layer structure extending in the longitudinal direction in the center of the rectangular parallelepiped. The oxidization is controlled to be stopped when a width W (in the plane direction) of the remaining areas of the laminated layers is equal to about 10 nm. Thereafter, the nitride layers are removed. 20 silicon one-dimensional quantum lines 67 having a sectional area of about 10 nm square and extending in the longitudinal direction in the center of the rectangular parallelepiped are arranged at intervals of 20 nm in the perpendicular direction to the substrate (FIG. 5B).

In FIG. 5B, the section of the rectangular parallelepiped is illustrated schematically. Then, a gate electrode 68 is formed so that it straddles the quantum lines 67 over the oxide layers and the nitride layers and source and drain electrodes 69 and 70 are connected to both ends of the quantum lines (FIG. 5C).

According to the above element, it is considered that extremely high-speed transistor operation is attained. This is considered by the fact that the mobility of electrons in a channel made of the one-dimensional quantum lines 67 is very large. Further, it is considered that even if a length of the channel is shortened, remarkable short channel effect does not occur and accordingly the element is suitable for fine-structuring.

Further, the nitride layers covering the sides of the rectangular parallelepiped are used to increase the thickness of the lines at channel ends so as to facilitate connection of the line channel and the gate and drain electrodes, while it is preferable that the nitride layers are not used when the channel length is short. In this case, it is preferable that the ends of the rectangular parallelepiped are removed by etching after the oxidization to take out the lines outside. It is necessary to pay sufficient attention to connection of the lines and the electrodes in the same manner as the second embodiment. When it is necessary to shorten a distance between the gate and the channel, the oxide layer may be side-etched. The structure of the laminated layers and the thickness of the layers are not limited to those in the embodiment. However, in order to attain the high-speed performance, it is preferable that the thickness of the semiconductor layers is set to 20 nm or less. Further, in order to obtain the sufficient mutual conductance, it is preferable that the number of lines is large. The semiconductor hetero junction structure may be used as the laminated layers.

The positional relation of the channel and the gate in the embodiment is similar to the DELTA structure proposed as one aspect of an SOI-MOS transistor. However, a channel in the DELTA structure is produced along a gate oxide layer in the same manner as the conventional MOSFET, while in the embodiment the channel is produced in only an extremely limited area in the center of the insulative layer interposed between the gate. In the embodiment, since the sides of the channel are determined by the interface of the silicon and the oxide layers thereof, the sides are very smooth and influence of scattered electrons in the interface is small.

According to the present invention, the laminated layers including the semiconductor or metal layers and the insulative layers are formed on the substrate and are oxidized from the side thereof to form the oxidized area, so that the 0-dimensional quantum boxes or the one-dimensional quantum lines having the fine tunnel junctions surrounded by the oxidized area or the 0-dimension quantum boxes or the one-dimensional quantum lines made of the semiconductor or metal areas interposed between the oxidized area and the insulative thin layers are formed in the laminated layers. Thus, the semiconductor lithography apparatus and the device fabricating apparatus used in the conventional silicon integrated circuit fabrication can be used to accurately attain the dimension of several nm required to operate the electronic devices, such as single-electron elements, various quantum effect elements and the like at the room temperature.

Further, in the electronic device provides the columnar semiconductor or metal lines perpendicular to the substrate and the tunnel junctions or the quantum boxes disposed on the way thereof in the center portion of the cylindrical insulative layer pattern or by providing the semiconductor or metal lines extending in parallel to the substrate in the longitudinal direction in the center portion of the rectangular parallelepipedic insulative layer pattern, whereby the electronic device has a greatly improved performance as compared with the conventional electronic device is obtained.

What is claimed is:

1. A method of fabricating an electronic device comprising:
    a step of forming laminated layers including semiconductor or metal thin layers and insulative thin layers on a substrate;
    a step of patterning said laminated layers to form a laminated layer pattern;
    a step of subjecting said laminated layer pattern to an oxide producing process from a side thereof to form a one-dimensional quantum wire including fine tunnel junctions; and
    wherein said electronic device has a first electrode coupled to said quantum wire at one end along a longitudinal direction thereof, a second electrode coupled to said quantum wire at another end of the longitudinal direction thereof, and a third electrode provided in the periphery of said quantum wire, and wherein said electronic device is operable as a single-electron transistor.

2. A method of fabricating an electronic device according to claim 1, wherein said laminated layers include a silicon layer, an insulative thin layer, a silicon layer, an insulative thin layer and a silicon layer formed in that order from said substrate and a thickness of said insulative thin layer is equal to or smaller than 20 nm.

3. A method of fabricating an electronic device according to claim 1, wherein said laminated layers include a silicon layer, an insulative thin layer, a silicon layer, an insulative thin layer and a silicon layer formed in that order from said substrate and a thickness of said silicon layer interposed between said two insulative thin layers is equal to or smaller than 20 nm.

4. A method of fabricating an electronic device comprising a first step of forming laminated layers including semiconductor or metal thin layers and insulative layers on a substrate, a second step of patterning said laminated layers to form a laminated layer pattern, and a third step of subjecting said laminated layer pattern to an oxide producing process from a side thereof by a predetermined thickness to form a metal or semiconductor line in said laminated layers; and
    wherein said electronic device has a first electrode coupled to said quantum wire at one end along a longitudinal direction thereof, a second electrode coupled to said quantum wire at another end of the longitudinal direction thereof, and a third electrode provided in the periphery of said quantum wire, and wherein said electronic device is operable as a single-electron transistor.

5. A method of fabricating an electronic device according to claim 4, further comprising a step of forming a plurality of said laminated layer patterns on said substrate so as to perform said third step to said plurality of laminated layer patterns simultaneously.

6. A method of fabricating an electronic device comprising:
    a step of forming laminated layers including semiconductor or metal thin layers and insulative thin layers on a substrate;
    a step of patterning said laminated layers to form a laminated layer pattern;
    a step of subjecting said laminated layer pattern to an oxide producing process from the side thereof to form a 0-dimensional quantum box made of semiconductor or metal area surrounded by said insulative thin layers and oxide area formed by said oxide producing process; and
    wherein said electronic device has a first electrode coupled to said quantum wire at one end along a longitudinal direction thereof, a second electrode coupled to said quantum wire at another end of the longitudinal direction thereof, and a third electrode provided in the periphery of said quantum wire, and wherein said electronic device is operable as a single-electron transistor.

7. A method of fabricating an electronic device according to claim 6, wherein said laminated layer pattern is in the form of a substantially vertical pillar relative to said substrate and said pillar-shaped laminated layers are oxidized from the side thereof to thereby form a 0-dimensional quantum box which extends in a substantially perpendicular direction relative to said substrate in the center of said pillar.

8. A method of fabricating an electronic device according to claim 6, wherein said laminated layers include a silicon layer, an insulative thin layer, a silicon layer, an insulative thin layers and a silicon layer formed in that order from said substrate and a thickness of said insulative thin layers is equal to or smaller than 20 nm.

9. A method of fabricating an electronic device according to claim 6, wherein said laminated layers include a silicon layer, an insulative thin layer, a silicon layer, an insulative thin layers and a silicon layer formed in that order from said substrate and a thickness of said silicon layer interposed between said two insulative thin layers is equal to or smaller than 20 nm.

10. A method of fabricating an electronic device comprising:
    a step of forming laminated layers including semiconductor or metal thin layers and insulative thin layers on a substrate;
    a step of patterning said laminated layers to form a laminated layer pattern;
    a step of subjecting said laminated layer pattern to an oxide producing process from the side thereof to form a 0-dimensional quantum box made of a semiconductor or metal area surrounded by said insulative thin layers and an oxide area formed by said oxide producing process;
    wherein said electronic device has a first electrode coupled to said quantum wire at one end along a longitudinal direction thereof, a second electrode coupled to said quantum wire at another end of the longitudinal direction thereof, and a third electrode provided in the periphery of said quantum wire, and wherein said electronic device is operable as a single-electron transistor; and
    wherein said oxide producing process is performed until an oxidization speed is less than or equal to one fifth of a value in bulk of said semiconductor or metal.

* * * * *